United States Patent
Zhang et al.

(10) Patent No.: US 7,564,658 B2
(45) Date of Patent: Jul. 21, 2009

(54) COFE INSERTION FOR EXCHANGE BIAS AND SENSOR IMPROVEMENT

(75) Inventors: Kunliang Zhang, Milpitas, CA (US); Hui-Chuan Wang, Pleasanton, CA (US); Tong Zhao, Milpitas, CA (US); Min Li, Dublin, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 389 days.

(21) Appl. No.: 10/948,021

(22) Filed: Sep. 23, 2004

(65) Prior Publication Data

US 2006/0061915 A1 Mar. 23, 2006

(51) Int. Cl.
G11B 5/33 (2006.01)
(52) U.S. Cl. ................................. 360/324.11
(58) Field of Classification Search .............. 360/324.1, 360/324.11, 324.12; 29/603.14
See application file for complete search history.

(56) References Cited

U.S. PATENT DOCUMENTS

| | | | | |
|---|---|---|---|---|
| 5,756,191 | A * | 5/1998 | Hashimoto et al. | 428/209 |
| 5,780,176 | A * | 7/1998 | Iwasaki et al. | 428/811.2 |
| 6,181,537 | B1 * | 1/2001 | Gill | 360/324.2 |
| 6,222,707 | B1 | 4/2001 | Huai et al. | 360/324.1 |
| 6,326,637 | B1 | 12/2001 | Parkin et al. | 257/9 |
| 6,338,899 | B1 | 1/2002 | Fukuzawa et al. | 428/332 |
| 6,496,337 | B1 | 12/2002 | Wang et al. | 360/324.12 |
| 6,507,457 | B2 | 1/2003 | He et al. | 360/126 |
| 6,833,981 | B2 * | 12/2004 | Suwabe et al. | 360/324.1 |
| 6,989,971 | B2 * | 1/2006 | Lin et al. | 360/322 |
| 7,092,222 | B2 * | 8/2006 | Hasegawa et al. | 360/324.11 |
| 7,201,827 | B2 * | 4/2007 | Horng et al. | 204/192.2 |
| 2002/0024780 | A1 * | 2/2002 | Mao et al. | 360/324.11 |
| 2002/0191356 | A1 * | 12/2002 | Hasegawa et al. | 360/324.11 |
| 2003/0143431 | A1 | 7/2003 | Hasegawa | 428/692 |
| 2004/0105193 | A1 | 6/2004 | Horng et al. | 360/324.11 |
| 2004/0121185 | A1 | 6/2004 | Fukuzawa et al. | 428/692 |
| 2004/0136121 | A1 * | 7/2004 | Mao et al. | 360/324.11 |

* cited by examiner

*Primary Examiner*—Angel A. Castro
(74) *Attorney, Agent, or Firm*—Saile Ackerman LLC; Stephen B. Ackerman

(57) ABSTRACT

A GMR spin value structure with improved performance and a method for making the same is disclosed. A key feature is the incorporation of a thin ferromagnetic insertion layer such as a 5 Angstrom thick CoFe layer between a NiCr seed layer and an IrMn AFM layer. Lowering the Ar flow rate to 10 sccm for the NiCr sputter deposition and raising the Ar flow rate to 100 sccm for the IrMn deposition enables the seed layer to be thinned to 25 Angstroms and the AFM layer to about 40 Angstroms. As a result, $H_E X$ between the AFM and pinned layers increases by up to 200 Oe while the Tb is maintained at or above 250° C. When the seed/CoFe/AFM configuration is used in a read head sensor, a higher GMR ratio is observed in addition to smaller free layer coercivity ($H_{CF}$), interlayer coupling ($H_E$), and $H_K$ values.

16 Claims, 2 Drawing Sheets

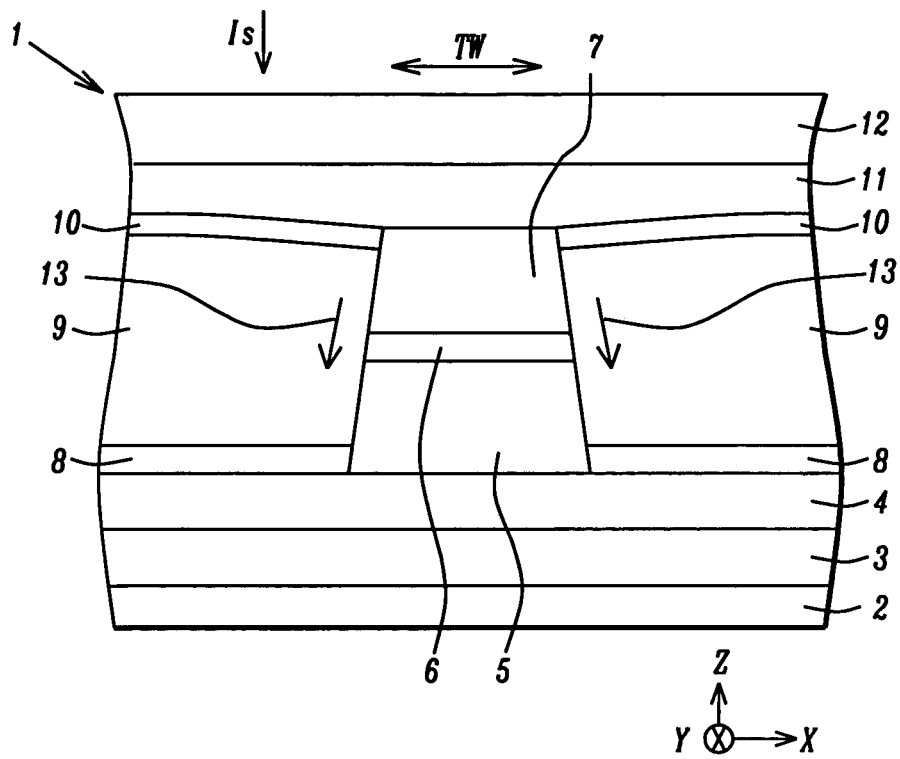
FIG. 1 – Prior Art
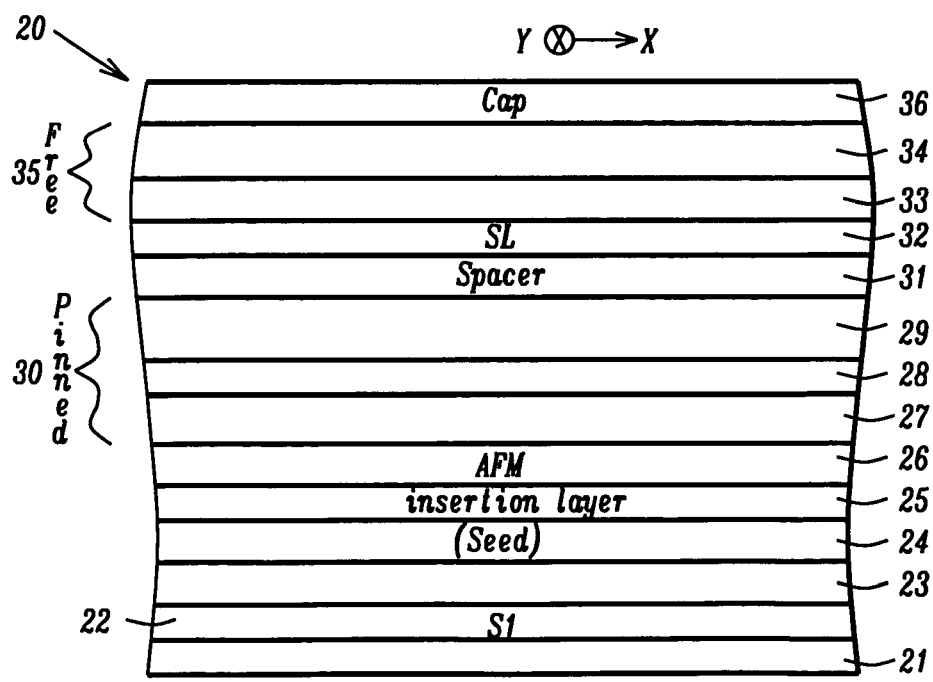
FIG. 2

COFE INSERTION FOR EXCHANGE BIAS AND SENSOR IMPROVEMENT

FIELD OF THE INVENTION

The invention relates to an improved spin valve for use in a giant magnetoresistive (GMR) sensor in a magnetic read head and to a method for making the same. In particular, a ferromagnetic insertion layer is used between a seed layer and AFM layer to enhance the exchange bias field, increase blocking temperature, and improve the magnetoresistive effect as well as the free layer softness.

BACKGROUND OF THE INVENTION

A magnetic disk drive includes read and write heads that may form a merged head attached to a slider on a positioning arm. During a read or write operation, the read and write heads are suspended over a magnetic disk on an air bearing surface (ABS). The read head has a sensor which is a critical component since it is used to detect magnetic field signals by a resistance change. One form of magnetoresistance is a spin valve magnetoresistance (SVMR) or giant magnetoresistance (GMR) which is based on a configuration in which two ferromagnetic layers are separated by a non-magnetic conductive layer in the sensor stack. One of the ferromagnetic layers is a pinned layer in which the magnetization direction is fixed by exchange coupling with an adjacent anti-ferromagnetic (AFM) or pinning layer. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. A higher resistance is observed when the free layer and pinned layer magnetization vectors are aligned parallel to one another than when they are aligned orthogonal to each other. In a CPP configuration, a sense current is passed through the sensor in a direction perpendicular to the layers in the stack. Alternatively, there is a current-in-plane (CIP) configuration where the sense current passes through the sensor in a direction parallel to the planes of the layers in the sensor stack.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because when the power consumption in the sensor is made constant to avoid a temperature rise, the output voltage is roughly inversely proportional to the square root of the sensor area. Therefore, a stronger output signal is achieved as the sensor size decreases. The sensor area at the ABS plane for greater than 100 Gb/in$^2$ density is smaller than 0.1×0.1 microns.

An important characteristic of a GMR head is the magnetoresistive (GMR) ratio which is dR/R where dR is the change in resistance of the spin valve sensor as the result of applying an external magnetic field and R is the resistance of the spin valve sensor before the change. A higher ratio is desired for improved sensitivity and it is well known that one way this result can be achieved is to incorporate a thin free layer in the spin valve structure. To further improve the GMR ratio, reduction of current shunting around the conductive layer (spacer) and structural growth optimization are needed.

Referring to FIG. 1, a conventional read head 1 based on a GMR configuration is shown and is comprised of a substrate 2 upon which a first shield 3 and a first gap layer 4 are formed. There is a GMR element comprised of a bottom portion 5, a spacer 6 such as a copper layer, and a top portion 7 that are sequentially formed on the first gap layer 4. The GMR element may be a bottom spin valve in which the bottom portion 5 is comprised of a lower seed layer, an AFM pinning layer, and an upper pinned layer (not shown) while the top portion 7 includes a free layer on the spacer 6. Alternatively, the GMR element may be a top spin valve where the pinned layer and AFM layer are sequentially formed above the spacer and the bottom portion 5 includes a free layer adjacent to the spacer. There are seed layers 8 and hard bias layers 9 disposed on the first gap layer 4 and along the GMR element. Leads 10 are formed on the hard bias layers 9 to carry current to and from the GMR element. The distance between the leads 10 defines the track width TW of the read head 1. Above the leads 10 and top portion 7 are formed a second gap layer 11 and a second shield 12. Although most of the sense current $I_s$ passes through the GMR element in this CPP configuration, a portion 13 of $I_s$ is shunted around the spacer 6 and reduces the output signal during a read operation.

For a bottom spin valve which is generally preferred over a top spin valve, decreasing the seed layer thickness and AFM layer thickness could help to reduce current shunting somewhat. A thinner seed layer and AFM layer could also provide an improvement in growth morphology (grain size and smoothness) that would increase the specularity of the seed layer/AFM layer interface and thus improve the GMR effect. For example, it is known that if an IrMn AFM layer is thinned from 70 to 55 Angstroms, there would be an immediate gain in dR/R of 7%. Since the interfaces between the various layers in a bottom spin valve stack are smoother as a result of a thinner AFM layer, the interlayer coupling between the AFM layer and free layer is desirably reduced as well. However, there is a limit to the minimum thickness for seed layers and AFM layers in current technology. Due to the finite size effect, thinning the AFM layer thickness will eventually cause the blocking temperature to drop significantly and thereby produce a potential hazard in thermal reliability. Furthermore, in a bottom spin valve, the seed layer must have large enough grains to promote the grain growth in the overlying AFM layer. If the seed layer is too thin, the AFM grains that contribute to the exchange bias cannot be established which results in a head stability problem.

Besides failing to achieve a large enough exchange bias field (HEX), improper AFM grain size will lead to a large magnetic training effect. A magnetic training effect refers to a reduction in the switching fields or $H_{EX}$ and $H_C$ as the magnetic field is repeatedly swept. For example, the magnitude of $H_{EX}$ and $H_C$ will shrink significantly after several cycles. Therefore, a method is needed that provides a thinner seed layer and AFM layer without reducing the blocking temperature (Tb) and compromising $H_{EX}$.

Magnetic seed layers are also used in magnetic heads as described in U.S. Pat. No. 6,507,457 where a NiFeCr/FeCoZrTa seed layer configuration is used between an insulation layer and the top of a magnetic core. The FeCoZrTa top layer exhibits an increase in magnetic moment (Bs) after an annealing step.

In related art found in U.S. Pat. No. 6,326,637, a NiFe seed layer is inserted between a Pt seed layer and an OsMn AFM layer to improve the growth of the OsMn alloy. A high thermal stability and magnetoresistance is observed. However, the blocking temperature where the net magnetic moment no longer has a fixed orientation appears to be low even when Ir is added to OsMn to raise the Tb. Generally, a Tb of 250° C. or higher is needed so that the finished read head can withstand temperatures during subsequent processing.

In U.S. patent application 2004/0105193, a NiCr seed layer with 31 atomic % Cr is used to enable an overlying PtMn AFM layer in a bottom spin valve to be thinned to 80 Angstroms and thereby improves GMR performance.

A seed enhancement layer between a seed layer and a free layer in a top spin valve is disclosed in U.S. Pat. No. 6,496,337. Insertion of this seed enhancement layer that may be NiCu, for example, enables a thinner free layer and a higher GMR ratio.

In U.S. Pat. No. 6,222,707, a seed layer is comprised of NiFeCr or a NiFe/Cr multilayer and is selected to have a high resistivity to avoid shunting current away from the spin valve. Similarly, in U.S. Pat. No. 6,338,899 and U.S. Patent Application 2004/0121185, a material with high specific resistance such as NiFeCr is used in a Ru/NiFeCr composite seed layer in a bottom spin valve for shunt current control. U.S. Patent Application 2003/0143431 teaches the use of a low resistivity material such as NiFe alloy or Cr as a seed layer in a CPP type magnetic sensing element.

SUMMARY OF THE INVENTION

One objective of the present invention is to provide a spin valve structure in a GMR sensor that incorporates a thin seed layer and/or thin AFM layer to improve the GMR ratio without lowering Tb or $H_{EX}$.

A further objective of the present invention is to incorporate an insertion layer between a seed layer and AFM layer in a spin valve structure that will enhance Tb and $H_{EX}$ for the device.

A still further objective of the present invention is to provide a method of forming a spin valve structure according to the first two objectives that has a larger process window than current fabrication methods.

The first two objectives are achieved in a bottom spin valve structure in which a ferromagnetic insertion layer is introduced between a seed layer and an overlying AFM layer. The spin valve may be part of a GMR sensor, MTJ (magnetic tunnel junction), or TMR device, In the exemplary embodiment, a bottom spin valve is formed in a GMR sensor. A gap layer is disposed on a first shield that has been formed on a substrate. A NiCr seed layer which is the bottom layer in a spin valve stack is formed on the first gap layer. A key feature is that a ferromagnetic layer such as CoFe is inserted between the NiCr seed layer and an overlying AFM layer. In one embodiment, the spin valve stack is completed by sequentially forming a pinned layer, a copper spacer, a surfactant layer (SL), a free layer, and a cap layer above an IrMn AFM layer. The pinned layer preferably has a synthetic anti-parallel (SyAP) configuration in which a bottom AP2 layer comprised of CoFe is separated from an upper AP1 CoFe layer by a Ru coupling layer. Additionally, the AP2 layer may have a FeTa insertion layer to increase the exchange bias field as well as specular reflection therein. The free layer is comprised of a CoFe/FeNi bilayer and the cap layer preferably has a Ru/Ta configuration. The CoFe insertion layer is advantageously used to enable the NiCr seed layer thickness to be decreased from 45 Angstroms to 25 Angstroms without causing a thermal stability problem that is associated with thin seed layers in prior art. At the same time, the $H_{EX}$ between the AFM and pinned layer is increased and GMR ratio improves. The CoFe insertion layer also allows the AFM layer thickness to be reduced somewhat and thereby decreases the interlayer coupling with the free layer, increases the GMR ratio further, and improves free layer properties.

One method of forming the desired GMR sensor involves deposition of all the spin valve layers in a magnetron sputtering process. A key step is the deposition of the NiCr seed layer on the first gap layer. The inventors have discovered that a low Ar flow rate of about 10 standard cubic centimeters per minute (sccm) improves the growth morphology of the NiCr layer such that this seed layer can be thinned somewhat without lowering $H_{EX}$ and Tb. Another important step is implementing a high Ar flow rate during the AFM deposition of about 100 sccm. The remaining spin valve layers are deposited with a standard Ar flow rate of about 40 sccm. In one embodiment, the GMR sensor is fabricated by patterning a photoresist layer on the spin valve stack, ion beam etching to remove unwanted portions of the stack, and depositing a seed layer, hard bias layer, and leads adjacent to the sidewalls of the resulting GMR element. The photoresist layer is lifted off and then a second gap layer and a second shield are disposed on the leads and GMR element to complete the sensor.

BRIEF DESCRIPTION OF THE DRAWINGS

FIG. 1 is a cross-sectional view showing a prior art GMR sensor in which a portion of the sense current is shunted around the spacer in the spin valve structure.

FIG. 2 is a cross-sectional view of a GMR element that has a ferromagnetic insertion layer between a seed layer and AFM layer according to one embodiment of the present invention.

DETAILED DESCRIPTION OF THE INVENTION

Figure 3:
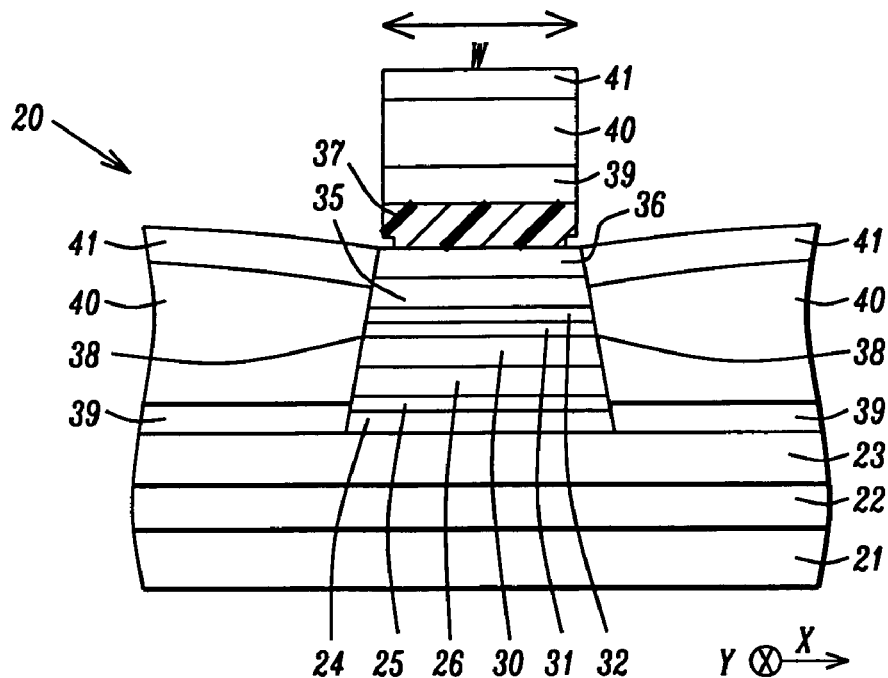
FIG. 3 is a cross-sectional view showing an intermediate step during the formation of a GMR sensor according to a method of the present invention.

The present invention is a spin valve structure that may be used in a sensor of a read head in a magnetic recording device and a method for making the same. The spin valve structure is especially suited for an ultra-high magnetic recording device wherein the recording density is greater than about 100 Gbits/in². The drawings are provided by way of example and are not intended to limit the scope of the invention. Although a bottom spin valve structure is described in the exemplary embodiment, those skilled in the art will appreciate that the seed layer/insertion layer/AFM configuration described herein may be incorporated in other applications including but not limited to a dual spin valve, CPP spin valve, MTJ, and TMR (tunneling magnetoresistive) devices. In other words, a ferromagnetic insertion layer may be added between a seed layer and adjacent AFM layer according to the present invention in any device based on a magnetoresistive effect.

A novel spin valve structure will be described first and then a method of forming the stack of layers in the spin valve structure will be provided. Referring to FIG. 2, a partially formed read head 20 is shown that has a substrate 21 such as a ceramic layer. Above the substrate is sequentially formed a first shield (S1) 22 and a first gap layer 23 that may be made of $Al_2O_3$, for example. A seed layer 24 that has a magnetoresistance enhancing property and is preferably comprised of NiCr with a composition of about 55 to 65 atomic % nickel is formed on the first gap layer 23. Optionally, the seed layer 24 may be NiCrFe or the like. The inventors have discovered that the seed layer 24 thickness may be reduced from about 45 Angstroms in prior art spin valve structures to 25 Angstroms in the present invention. This result is achieved by advantageously forming a ferromagnetic insertion layer 25 about 5 Angstroms thick on the seed layer 24. The insertion layer 25 acts as a seed layer to promote good morphology (adequate grain size and smooth crystal growth) in an overlying AFM layer 26. Preferably, the insertion layer 25 is comprised of CoFe with a Fe content of about 10 atomic weight %. Alternatively, the insertion layer may be comprised of other ferromagnetic materials such as CoFe alloys and NiFe alloys. A thin seed layer 24 is also possible because of an improved sputter deposition method which will be described in a later section.

An AFM layer 26 is formed on the insertion layer 25 and is preferably comprised of IrMn having a composition of about 18% iridium and a thickness of about 40 to 55 Angstroms. Because the insertion layer provides improved morphology in the AFM layer, the AFM thickness can be lowered to 40 Angstroms while still maintaining adequate Tb and $H_{EX}$ values. Note that the exchange coupling field ($H_{EX}$) between the AFM layer and adjacent pinned layer 30 should be large enough to keep the net magnetization vector in the pinned layer in a stable position. For instance, if the magnetization direction of the AFM layer 26 is set along the y-axis, then $H_{EX}$ should be of sufficient strength to maintain the net magnetization direction of the pinned layer 30 along the y-axis. It is understood that the magnetization direction of the AFM layer is set during deposition or by an annealing process following deposition. One benefit of a thin AFM layer 26 is a higher GMR ratio which will be discussed later with respect to Table 2. In another embodiment, the AFM layer may be comprised of MnPt or PdPtMn or the like with an appropriate thickness as understood by those skilled in the art.

A pinned layer 30 is formed on the AFM layer 26 and is preferably comprised of a SyAP AP2/Ru/AP1 configuration. The AP2 layer 27 may be comprised of CoFe with a composition of about 75 to 90 atomic % cobalt and preferably 90% cobalt with a thickness of about 10 to 25 Angstroms. The magnetic moment of the AP2 layer 27 is pinned in a direction anti-parallel to the magnetic moment of the AP1 layer 29. The AP2 layer 27 may be slightly thinner than the AP1 layer 29 to produce a small net magnetic moment for the pinned layer 30 along the y-axis. Exchange coupling between the AP2 layer and the AP1 layer is facilitated by a coupling layer 28 that is preferably comprised of Ru with a thickness of about 7.5 Angstroms although Rh or Ir may be used instead. In one embodiment, the AP2 layer 27 is further comprised of an insertion layer (not shown) made of FeTa with a thickness of about 6 Angstroms that is sandwiched between a 6 Angstrom thick lower CoFe layer and a 7 Angstrom thick upper CoFe layer. This AP2 configuration is hereafter referred to as a "667" layer and is magnetically coupled to the AFM layer. The FeTa layer has a Ta content of about 2 to 15 atomic % and increases specular reflection within the AP2 layer and the $H_{EX}$ with the AFM layer 26. The AP1 layer 29 may be comprised of CoFe with a composition of about 75 to 90 atomic % cobalt and has a thickness of 15 to 25 Angstroms. A small net magnetic moment in a SyAP pinned layer 30 results in improved exchange coupling between the AP2 layer and the AFM layer 26 and also reduces interlayer coupling between the pinned layer and an overlying free layer 35.

A copper spacer 31 with a thickness of about 15 to 20 Angstroms and preferably 18 Angstroms is formed on the pinned layer 30. In a preferred embodiment, an oxygen surfactant layer (SL) 32 is formed on a copper spacer 31 by a method known to those skilled in the art, The oxygen surfactant layer 32 is less than about 1 atomic layer in thickness and is used to improve lattice matching between the copper spacer and the overlying free layer 35. In other words, the oxygen surfactant layer 32 relieves stress in the spin valve structure 20 and is also used to grow a smooth overlying magnetic layer. It is understood that the oxygen surfactant layer 32 is an oxygen layer absorbed on the Cu spacer 31 and is not a copper oxide. In a less preferred embodiment, the oxygen surfactant layer 32 may be omitted.

A free layer 35 is formed on the oxygen surfactant layer 32. In one embodiment (not shown), the free layer 35 is a single ferromagnetic layer such as CoFe with a thickness of about 20 to 30 Angstroms. Preferably, the free layer 35 is a composite CoFe/NiFe layer comprised of a bottom CoFe layer 33 on the oxygen surfactant layer 32 and an upper NiFe layer 34 disposed on the bottom CoFe layer. The CoFe layer 33 has a cobalt content of about 90 atomic % and a thickness between about 5 to 15 Angstroms. The NiFe layer 34 has a composition of about 25 to 85 atomic % Ni and a thickness between 10 and 30 Angstroms. Alternatively, an insertion layer (not shown) similar to the one described previously in the AP2 layer 27 may be incorporated in the NiFe layer 34 to increase interfacial scattering and thereby increase the magneto-resistive effect. In a low resistance magnetic state, the free layer 35 has a magnetization vector along the x-axis while in a higher magnetic state, the magnetization direction is along the y-axis.

The top of the spin valve stack is preferably comprised of capping layer 36 with a Ru/Ta configuration wherein the Ru layer has a thickness of about 5 Angstroms and the overlying Ta layer has a thickness of about 20 Angstroms. However, other capping layer configurations known to those skilled in the art may be used.

Figure 4:
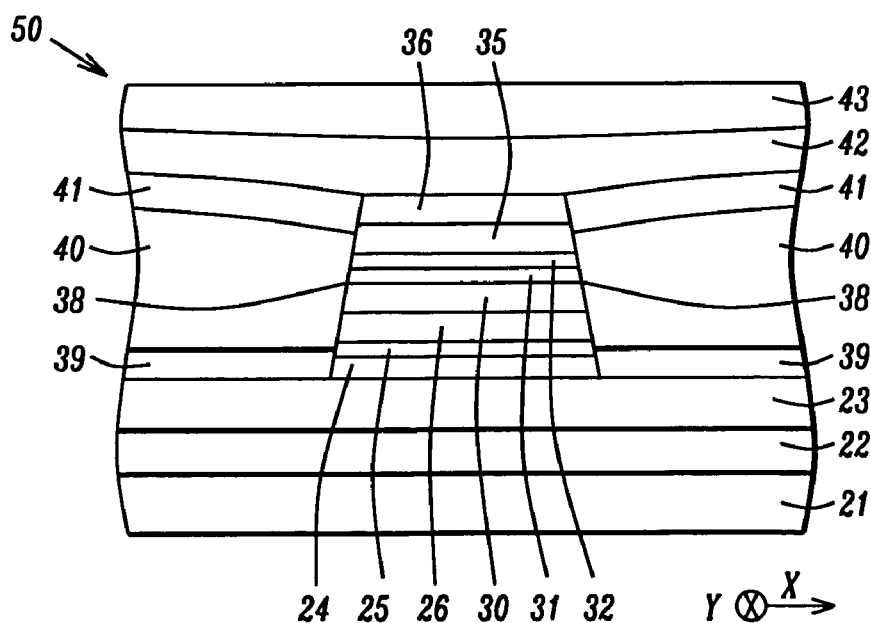
FIG. 4 is a cross-sectional view of a completed GMR sensor structure according to one embodiment of the present invention.

The partially formed read head 20 may be completed by a process sequence described in a later section to form a completed read head 50 as shown in FIG. 4. Note that the spin valve stack has been modified to form a GMR element with sidewalls 38, and bounded on the top and bottom by capping layer 36 and seed layer 24, respectively. Typically, the sidewalls are sloped such that the cap layer 36 has a smaller width than the first seed layer 24. In one embodiment, a second seed layer 39 such as CrTi, TiW, or CrMo with a body centered cubic (bcc) lattice is formed on regions of the first gap layer 23 not covered by the first seed layer 24 and along a bottom portion of each sidewall 38. The second seed layer 39 is used to assure a smooth, uniform crystal growth in the overlying hard bias layer 40 that is CoCrPt, for example. The hard bias layer 40 provides a longitudinal bias to maintain the magnetization direction in the adjoining free layer 35 along the x-axis in a low magnetic state.

An electrical lead 41 is formed on a hard bias layer 40 along each sidewall 38. Although the leads 41 are shown connected to the sidewalls of the GMR element, the present invention also anticipates a configuration in which the leads are attached to the top surface of the cap layer 36 near each sidewall. The leads 41 may be a composite layer in which a thicker conductive layer such as Au or Cu is sandwiched between thinner Ta layers.

The remainder of the completed read head 50 is comprised of a second gap layer 42 disposed on the leads 41 and cap layer 36, and a second shield (S2) formed on the second gap layer.

To demonstrate the various improvements realized by including a ferromagnetic insertion layer between a seed layer and an AFM layer according to the present invention, sample configurations were prepared by a dc magnetron sputtering process on an $Al_2O_3$ substrate. The control sample (T1) was fabricated by sequentially depositing a 45 Angstrom thick NiCr seed layer with a 40 sccm Ar flow rate, an 18% IrMn (55 Angstrom thick) AFM layer using a standard 40 sccm Ar flow rate, a "677" AP2 layer, and a (Ru/Ta) cap layer. For samples T2-T8, the NiCr and 18% IrMn thicknesses were varied as well as the Ar flow rates used in the deposition of these layers. The process change involving Ar flow rate that contributes to better performance will be described in more detail in a later section.

TABLE 1

Properties of Various Magnetic Configurations

| Sample | Configuration | Hc (Oe) | $H_{EX}$ (Oe) | Tb (° C.) |
|---|---|---|---|---|
| T1 | NiCr45(40 sccm)/IrMn55(40 sccm)/667/cap | 480.15 | 1733.14 | 285 +/− 10 |
| T2 | NiCr45/(10 sccm)/IrMn55(100 sccm)/667/cap | 337 | 1787 | 285 +/− 10 |
| T3 | NiCr37(10 sccm)/IrMn45(100 sccm)/667/cap | 365 | 1886 | 250 +/− 10 |
| T4 | NiCr30(10 sccm)/CoFe5/IrMn55(100 sccm)/667/cap | 339.1 | 1885.5 | 280 +/− 10 |

TABLE 1-continued

Properties of Various Magnetic Configurations

| Sample | Configuration | Hc (Oe) | $H_{EX}$ (Oe) | Tb (° C.) |
|---|---|---|---|---|
| T5 | NiCr25(10 sccm)/CoFe5/IrMn55(100 sccm)/667/cap | 341.85 | 1903.2 | 280 +/− 10 |
| T6 | NiCr25(10 sccm)/CoFe5/IrMn50(100 sccm)/667/cap | 319.8 | 1870 | 275 +/− 10 |
| T7 | NiCr25(10 sccm)/CoFe5/IrMn45(100 sccm)/667/cap | 376 | 1910 | 260 +/− 10 |
| T8 | NiCr25(10 sccm)/CoFe5/IrMn40(100 sccm)/667/cap | 380 | 1882 | 245 +/− 10 |

The conditions shown in sample T1 represent a small process window since NiCr seed layers deposited at 40 sccm with a thickness below 40 Angstroms result in an unstable $H_{EX}$ and a stability problem. A small improvement is observed for sample T2 where the Ar flow rate for NiCr deposition is decreased to 10 sccm and the Ar flow rate for IrMn deposition is raised to 100 sccm which gives a higher $H_{EX}$ without a loss in Tb. Sample T3 shows that a higher $H_{EX}$ and an acceptable Tb is realized when NiCr thickness is thinned to 37 Angstroms and IrMn thickness lowered to 45 Angstroms. Under these conditions, if the NiCr layer is thinned below 37 Angstroms (no sample listed), $H_{EX}$ as well as Tb will become marginal. The inventors have discovered the following advantages when a 5 Angstrom thick CoFe layer is inserted between the NiCr and IrMn layers. First, the NiCr thickness can be thinned to 25 Angstroms (T5-T8) while achieving a high $H_{EX}$ value and acceptable Tb results. Secondly, comparing T7 to T3, a 5 to 10 degree gain in Tb is realized. Additionally, the Tb dependence on NiCr thickness is quite small which translates to a larger process window than afforded by prior art configurations with standard process conditions. A third improvement is that $H_{EX}$ is enhanced by 100 to 200 Oe as demonstrated by comparing sample T5 to T1.

A second experiment was conducted to determine the benefits of adding a 5 Angstrom thick CoFe insertion layer between a NiCr seed layer and an 18% IrMn AFM layer in a GMR spin valve structure. The spin valve is similar to the one described previously that was employed in the partially formed read head 20 (FIG. 2) and the completed read head 50 (FIG. 4) and is represented by the configuration NiCr45/IrMn/"667"/Ru/CoFe20/Cu/SL/free layer/Ru5/Ta20. The AP2 layer in the SyAP pinned layer has the "667" configuration and is separated from a 20 Angstrom thick AP1 CoFe layer by a Ru coupling layer. In this example, the free layer has a CoFe/FeNi configuration. As mentioned previously, the CoFe insertion layer may be considered a seed layer and is shown as a second seed layer in Table 2. Samples A2-A4 were deposited with a 10 sccm Ar flow rate for the seed layers and a 100 sccm Ar flow rate for the IrMn AFM layer. All other layers were formed using a 40 sccm Ar flow rate in a process chamber of an Anelva DC magnetron sputtering system.

TABLE 2

GMR properties for IrMn/"667" with various seed layers

| Sample | Seed Layers | IrMn (Ang.) | $H_E$ | $H_{CF}$ | $H_K$ | $R_S$ | dR/R | dR | Tb (° C.) |
|---|---|---|---|---|---|---|---|---|---|
| A1 | NiCr45 | 55 | 29.82 | 4.86 | 25.57 | 24.65 | 14.79% | 3.65 | 285 |
| A2 | NiCr25/CoFe5 | 55 | 27.45 | 1.95 | 25.25 | 25.14 | 15.97% | 4.01 | 285 |
| A3 | NiCr25/CoFe5 | 45 | 17.94 | 2.76 | 15.81 | 25.29 | 16.52% | 4.18 | 260 |
| A4 | NiCr25/CoFe5 | 40 | 13.46 | 2.37 | 11.91 | 25.24 | 16.67% | 4.21 | 245 |

One advantage of the CoFe insertion (seed) layer is a 10% gain in dR as observed when comparing sample A2 to A1. Furthermore, the improved morphology provided by the CoFe insertion layer enables the IrMn AFM thickness to be thinned from 55 Angstroms to 45 Angstroms (sample A3) or to 40 Angstroms (sample A4) that yields another 5% gain in dR. Note that the GMR ratio improves accordingly from 14.79% (A1) to a range of 15.97% to 16.67% for samples A2-A4. Other benefits associated with the CoFe insertion layer are a lower interlayer coupling field ($H_E$) between the free layer and pinned layer ("667/Ru/CoFe20 configuration) as well as a smaller free layer coercivity ($H_{CF}$) and lower $H_K$ which all lead to improved performance in the final device. These improvements are achieved simultaneously with a higher $H_{EX}$ value mentioned previously with respect to data in Table 1. Overall, there is a significant increase in GMR performance while maintaining Tb at or above a target of about 250° C.

The present invention is also a method of forming the spin valve structure described previously that has a ferromagnetic insertion layer between a seed layer such as NiCr and an AFM layer. Referring again to FIG. 2, a substrate 21 is provided that may be a ceramic layer. In the exemplary embodiment where the spin valve structure is part of a GMR sensor, a first shield 22 and first gap layer 23 as described earlier are sequentially formed on the substrate 21 by conventional methods. Alternatively, the spin valve may be employed as a magnetic tunnel junction (MTJ) or TMR device in a Magnetic Random Access Memory (MRAM) array in which case the layers 22, 23 may be a conductive element and a capping layer, respectively, in a word line or bit line as appreciated by those skilled in the art.

All the layers in the spin valve stack may be deposited in a process chamber after a single pump down to reach a low pressure in the system. Preferably, a DC magnetron sputter system such as one available from Anelva is employed that is capable of a base pressure of at least $1 \times 10^{-8}$ torr and preferably less than $5 \times 10^{-9}$ torr to about $1 \times 10^{-9}$ torr. A low base pressure allows films to be sputter deposited with higher uniformity and reproducibility. It is understood that a sputter chamber may have multiple targets which are low pressure discharge cathodes. For instance, if a CoFe layer is to be deposited, Co and Fe targets are bombarded simultaneously to afford the desired film composition on a substrate. Typically, argon is used as the sputter gas.

According to the preferred method of the exemplary embodiment, a seed layer 24 that is preferably NiCr is deposited on the first gap layer 23. As noted earlier, the inventors previously practiced a method in which a 40 sccm Ar flow rate was used for the deposition. However, the inventors have discovered that by reducing the flow rate to a range of 5 to 15 sccm, and preferably 10 sccm, a thinner NiCr seed layer 24 can be formed without degrading $H_{EX}$ or Tb. A subsequently formed CoFe insertion layer 25 also enables a thinner seed layer 24. When the seed layer 24 is made of NiCr, its thickness is in the range of 20 to 45 Angstroms and is preferably 25 Angstroms. Note that the prior art method did not allow a NiCr seed layer to be thinned below 40 Angstroms without degrading $H_{EX}$ and Tb. The seed layer 24 serves to increase the specular reflection at interfaces within the subsequently formed spin valve stack. Optionally, a NiCrFe layer or composite NiFeCr/NiFe layer may be used as the seed layer 24.

Next, a key feature of the present invention is that a ferromagnetic insertion layer 25 such as CoFe with a Fe content of about 10 atomic % and a thickness between about 2 and 10 Angstroms and preferably 5 Angstroms is deposited on the NiCr seed layer 24. Optionally, a CoFe alloy or NiFe alloy may be used in place of CoFe. The insertion layer 25 is deposited with an Ar flow rate of 10 to 40 sccm and promotes improved morphology (grain size, smoothness) in a subsequently deposited AFM layer.

An AFM layer 26 that is preferably IrMn with an iridium content of about 18 atomic % and a thickness from about 40 to 70 Angstroms is deposited on the insertion layer 25. In another embodiment, the AFM layer 26 may be comprised of MnPt or PdPtMn with an appropriate thickness to establish a sufficiently strong exchange coupling field ($H_{EX}$) with a subsequently formed pinned layer 30. The inventors have found that by increasing the Ar flow rate from 40 sccm in a prior art method to about 100 sccm, an IrMn AFM layer 26 thickness can be reduced from a typical range of 55 to 70 Angstroms to about 45 to 60 Angstroms. A thinner IrMn AFM layer according to the present invention provides a higher GMR ratio and a larger process window. In other words, a higher GMR performance is achieved which is less sensitive to small changes in AFM thickness that occur during a normal manufacturing operation.

The remaining layers in the spin valve stack are deposited with Ar flow rates of about 10 to 40 sccm. In a preferred embodiment, a pinned layer 30, copper spacer 31, oxygen surfactant layer 32, free layer 35, and cap layer 36 are sequentially formed above the AFM layer 26. The pinned layer may have a SyAP configuration in which a Ru coupling layer separates a lower AP2 layer from an upper AP1 layer as described previously. Moreover, the AP2 layer may have an insertion layer such as FeTa. For example, the AP2 layer may be comprised of a lower CoFe layer (6 Angstroms thick), a middle FeTa layer (6 Angstroms thick), and an upper CoFe layer (7 Angstroms thick) referred to as a "667" configuration. The copper spacer 31 is formed with a thickness of about 15 to 20 Angstroms and preferably 18 Angstroms and has a top surface on which an oxygen surfactant layer 32 is formed by a natural oxidation process known to those skilled in the art. The oxygen surfactant layer (SL) 32 is a layer of oxygen about 1 atomic layer thick absorbed on the copper spacer. It is believed that the oxygen bound to the top surface of the copper spacer reacts with a subsequently deposited CoFe layer in the free layer 35 to form CoFeO and thereby prevents interdiffusion between the copper spacer 31 and overlying free layer. The Cu/CoFe interface thus formed is flat and smooth. Preferably, the free layer 35 has a CoFe/NiFe configuration and the cap layer 36 has a Ru/Ta configuration as described previously. All of the sputtered deposited films may be laid down in the same sputter chamber or in different sputter chambers within the same mainframe.

In one embodiment, the partially formed read head 20 is annealed in a magnetic field between about 5000 and 10000 oersted at a temperature between about 250° C. and 300° C. for a period of 5 to 10 hours. As mentioned earlier, the magnetization direction of the AFM layer (and pinned layer) may be set during the deposition process or following the formation of the spin valve structure.

Referring to FIG. 3, the process of forming the read head 20 in the exemplary embodiment is continued by a well known method. A photoresist layer 37 is patterned on the cap layer 36 and has a width w that is intended to be the track width. An ion beam etch (IBE) process is typically used to remove layers in the spin valve stack that are not protected by the photoresist layer 37 and forms sidewalls 38 that define the shape of a GMR element. It is understood that the photoresist layer 37 consists of a plurality of regions that are essentially rectangular in shape from a top view and these rectangular shapes are transferred through the spin valve stack of layers to form GMR elements that are generally arrayed in multiple rows and multiple columns on the first gap layer 23. The photoresist layer 37 has an undercut adjacent to the top of the sidewalls 38 to facilitate a lift-off removal in a subsequent step. A stack comprised of a second seed layer 39, a hard bias layer 40, and an electrical lead 41 is deposited by ion beam deposition (IBD) or the like on exposed regions of the first gap layer 23 and adjacent to the sidewalls 38. The second seed layer 39, hard bias layer 40, and lead 41 were described previously. Although the leads 41 are shown adjoining a top portion of the sidewalls 38, the leads may alternately be formed such that they contact a portion of the top surface of the cap layer 36 near the sidewalls 38.

Referring again to FIG. 4, the photoresist layer 37 is removed by a lift-off method known to those skilled in the art. A second gap layer 42 and second shield 43 are deposited by standard procedures not described herein. The top surface of the second shield 43 is preferably planarized by a chemical mechanical polish step, for example. Those skilled in the art will appreciate that the second magnetic shield (S2) 43 can be used as the top conductor lead layer in a CPP spin valve.

The method of forming a spin valve structure comprising a ferromagnetic insertion layer between a seed layer and an AFM layer according to the present invention affords several advantages over prior art. A larger process window is realized for forming the seed layer (NiCr) and AFM layer (IrMn). This means that the final device performance is more tolerant of small changes in seed layer and AFM layer thickness. In particular, a NiCr seed layer may be thinned to 25 Angstroms and an IrMn AFM layer can be thinned to about 40 Angstroms while achieving a high GMR performance and maintaining an acceptable Tb value. The modified sputter deposition method involving a 10 sccm Ar flow rate for NiCr seed layer formation and a 100 sccm Ar flow rate for IrMn deposition enables a spin valve with improved GMR performance in several categories including an enhancement in $H_{EX}$ by up to 200 Oe, a Tb increase of about 5 to 10° C., a higher GMR ratio, lower interlayer coupling ($H_E$), and smaller $H_{CF}$ and $H_K$ values.

While this invention has been particularly shown and described with reference to, the preferred embodiment thereof, it will be understood by those skilled in the art that various changes in form and details may be made without departing from the spirit and scope of this invention.

We claim:

1. A spin valve structure, comprising:
   (a) a seed layer comprised of NiCr, NiCrFe, or NiCrFe/NiFe formed on a substrate;
   (b) a ferromagnetic insertion layer comprised of CoFe or a CoFe alloy formed thereon;
   (c) an AFM layer disposed on the ferromagnetic insertion layer;
   (d) a pinned layer disposed on the AFM layer, said pinned layer has an AP2/Ru/AP1 trilayer configuration;
   (e) a copper spacer on the pinned layer;
   (f) an oxygen surfactant layer formed on the copper spacer; and
   (g) a free layer above the oxygen surfactant layer.

2. The spin valve structure of claim 1 wherein the substrate is a first gap layer in a magnetic read head.

3. The spin valve structure of claim 2 further comprised of a cap layer which is formed on the free layer.

4. The spin valve structure of claim 1 wherein the seed layer is NiCr with a thickness of about 20 to 45 Angstroms.

5. The spin valve structure of claim 1 wherein the ferromagnetic insertion layer is CoFe with a Fe content of about 10 atomic % and a thickness between about 2 and 10 Angstroms.

6. The spin valve structure of claim 1 wherein the AFM layer is IrMn with an iridium content of about 18 atomic % and a thickness of about 40 to 70 Angstroms.

7. The spin valve structure of claim 1 wherein the spin valve is a dual spin valve, a GMR spin valve, a CPP spin valve, an MTJ, or a TMR device.

8. A GMR spin valve structure, comprising:
   (a) a substrate with a seed layer formed thereon;
   (b) a ferromagnetic insertion layer on the seed layer;
   (c) an AFM layer formed on the ferromagnetic insertion layer;
   (d) a pinned layer disposed on the AFM layer;
   (e) a copper spacer on the pinned layer;
   (f) an oxygen surfactant layer formed on the copper spacer;
   (g) a free layer above the oxygen surfactant layer; and
   (h) a cap layer on the free layer.

9. The GMR spin valve structure of claim 8 wherein the substrate is a first gap layer that has been formed on a first shield in a magnetic read head.

10. The GMR spin valve structure of claim 8 wherein the seed layer is comprised of NiCr and has a thickness of about 20 to 45 Angstroms.

11. The GMR spin valve structure of claim 8 wherein the ferromagnetic insertion layer is comprised of CoFe, a CoFe alloy, or a NiFe alloy with a thickness between about 2 and 10 Angstroms.

12. The GMR spin valve structure of claim 8 wherein the AFM layer is comprised of IrMn with a thickness from about 40 to 70 Angstroms.

13. The GMR spin valve structure of claim 8 wherein the pinned layer has a synthetic anti-parallel (SyAP) configuration and is comprised of:
   (a) an AP2 layer formed on the AFM layer wherein the AP2 layer is comprised of a lower CoFe layer with a thickness of about 6 Angstroms, a middle FeTa insertion layer with a thickness of about 6 Angstroms, and an upper CoFe layer with a thickness of about 7 Angstroms;
   (b) a Ru coupling layer having a thickness of about 7.5 Angstroms on the AP2 layer; and
   (c) an AP1 CoFe layer with a thickness of about 15 to 25 Angstroms on the Ru coupling layer.

14. The GMR spin valve structure of claim 8 wherein the free layer has a CoFe/NiFe configuration in which the CoFe layer on the oxygen surfactant layer has a thickness of about 5 to 15 Angstroms and the NiFe layer has a Ni content from about 25 to 85 atomic % and a thickness of about 10 to 30 Angstroms.

15. The GMR spin valve structure of claim 8 wherein the cap layer is comprised of a lower Ru layer with a thickness of about 5 Angstroms and an upper Ta layer with a thickness of about 20 Angstroms.

16. The GMR spin valve of claim 8 wherein the copper spacer has a thickness of about 15 to 20 Angstroms and the oxygen surfactant layer has a thickness of about one atomic layer.

* * * * *